United States Patent
Yamanaka

(10) Patent No.: US 6,778,197 B2
(45) Date of Patent: Aug. 17, 2004

(54) IMAGE FORMING APPARATUS

(75) Inventor: Hiromichi Yamanaka, Shizuoka (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/316,949

(22) Filed: Dec. 12, 2002

(65) Prior Publication Data

US 2003/0117477 A1 Jun. 26, 2003

(30) Foreign Application Priority Data

Dec. 25, 2001 (JP) ........................................ 2001-391352

(51) Int. Cl.$^7$ ............................................. G03G 15/00
(52) U.S. Cl. ............................ 347/129; 399/75; 399/90
(58) Field of Search ................................. 347/129, 132, 347/138, 152, 237, 247, 263; 399/75, 90

(56) References Cited

U.S. PATENT DOCUMENTS

| | | | |
|---|---|---|---|
| 5,510,827 A | * | 4/1996 | Kubota et al. .............. 347/257 |
| 6,084,622 A | * | 7/2000 | Sugiura et al. ............. 347/170 |
| 6,151,057 A | * | 11/2000 | Yamazaki et al. .......... 347/248 |
| 6,477,345 B2 | * | 11/2002 | Kimura et al. .............. 399/107 |

* cited by examiner

Primary Examiner—Andrew H. Hirshfeld
Assistant Examiner—Leo T. Hinze
(74) Attorney, Agent, or Firm—Fitzpatrick, Cella, Harper & Scinto

(57) ABSTRACT

The image forming apparatus is provided with a driving circuit board for driving an apparatus main body, a control circuit board for controlling the apparatus main body, and an image controller board for controlling image data, in which the driving circuit substrate and the image controller board are arranged substantially vertically, and the control circuit board is arranged substantially horizontally. Consequently, a high-frequency wiring part can be shortened, and reduction of radiation field noises and costs for coping with the noises can be realized. Moreover, since heat radiation efficiency increases, deterioration of components and degradation of an image quality due to increase in temperature inside the apparatus can be prevented.

7 Claims, 6 Drawing Sheets

IMAGE FORMING APPARATUS

BACKGROUND OF THE INVENTION

1. Field of the Invention

The present invention relates to an image forming apparatus such as a laser printer or a copying machine that forms an image by an electrophotographic process and, in particular, to an apparatus having various electric substrates.

2. Related Background Art

An example of a configuration of functional components in a conventional laser printer is shown in FIG. 5. FIG. 5 is a sectional view of a conventional image recording apparatus. As shown in FIG. 5, the image recording apparatus has an engine control substrate 11 for controlling a printer engine, an image controller substrate 12 for generating bit map data to modulate ON/OFF a semiconductor laser based on image data sent from a host computer (not shown), a scanner unit 13 constituted by a semiconductor laser, a laser driving circuit, a horizontal synchronizing signal generation circuit, a polygon motor, a lens, a turnback mirror or the like, a process cartridge 14 constituted by a photosensitive drum, a charging roller, a developing device, a cleaner container or the like, a conveying path 15 for feeding and conveying a recording sheet, and a motor 16 functioning as a driving source for driving means for driving the conveying path 15.

In the image recording apparatus having the structure shown in FIG. 5, the engine control board 11 is arranged in a planar state below the conveying path 15, the image controller board 12 is arranged further below the engine control board 11, the scanner unit 13 is arranged above the conveying path 15, and the process cartridge 14 is arranged between the conveying path 15 and the scanner unit 13.

FIG. 6 is a functional block diagram of each circuit board. As shown in FIG. 6, the engine control board 11 is constituted by a switching power supply circuit part 11a, a motor driver circuit part 11b for performing sheet conveyance driving or the like, a high voltage power supply circuit part 11c necessary for an electrophotographic process, and an engine control circuit part 11d including a processor for controlling each driving circuit.

In addition, the image controller board 12 is constituted by a processor for generating bit map data to modulate ON/OFF the semiconductor laser based on image data from the host computer and communicating with an engine control circuit, a control ROM, an RAM 12a for temporarily storing the bit map data or the like.

The scanner unit 13 is constituted by a semiconductor laser driving circuit part 13a for driving the semiconductor laser based on the ON/OFF data from the image controller board 12, a polygon scanner 13b for horizontally scanning laser beams from the semiconductor laser on the photosensitive drum, a not-shown BD sensor for generating a horizontal synchronizing signal, and the like. The above is an example of the structure of the conventional image recording apparatus such as a laser printer.

However, in the above-mentioned conventional image recording apparatus, the engine control board 11 and the image controller board 12 are arranged in a planar state below the conveying path 15, and the scanner unit 13 is arranged above the conveying path 15. Thus, the engine control board 11 or the image controller board 12 and the scanner unit 13 are connected by a bundled line (cable or jumper) 17, FFC, or the like. Since the engine control substrate 11 or the image controller substrate 12 and the scanner unit 13 are arranged far from each other, wiring for them is long. In particular, since high resolution of a laser printer has been advanced in recent years, a frequency of a laser ON/OFF signal (VDO) has also become high. As a result, radiation field noises (RFI) have increased, and it tends to be difficult to cope with the radiation field noises.

In order to cope with the radiation field noises, a ferrite core is used in a bundled line or a shield electric wire is used, which leads to significant increase in costs.

Moreover, in the conventional image recording apparatus shown in FIGS. 5 and 6, the switching power supply circuit part 11a with a large heat value is arranged horizontally on a bottom surface of a main body of the image recording apparatus. Thus, heat radiation efficiency is low, and harmful effects such as deterioration of components and decrease in quality of an image due to increase in temperature in the apparatus are likely to occur. In addition, using air cooling means such as a fan in order to avoid the harmful effects leads to increase in costs.

SUMMARY OF THE INVENTION

An object of the present invention is to provide an image forming apparatus in which a high-frequency wiring part can be shortened to realize reduction of radiation field noises and costs for coping with the noises, and at the same time, heat radiation efficiency can be increased to prevent deterioration of components, degradation of an image quality, and the like due to increase in temperature in the apparatus.

Another object of the present invention is to provide an image forming apparatus including a driving circuit substrate for driving an apparatus main body, a control circuit substrate for controlling the apparatus main body, and an image controller substrate for controlling image data, in which the driving circuit substrate is connected to the control circuit substrate, and the control circuit substrate is connected to the image controller substrate, and in which the driving circuit substrate and the image controller substrate are provided substantially vertically, and the control circuit substrate is provided substantially horizontally.

Further objects of the present invention will be apparent in the following description.

DESCRIPTION OF THE PREFERRED EMBODIMENTS

Embodiments of the present invention will be hereinafter described with reference to the accompanying drawings.

Figure 1:
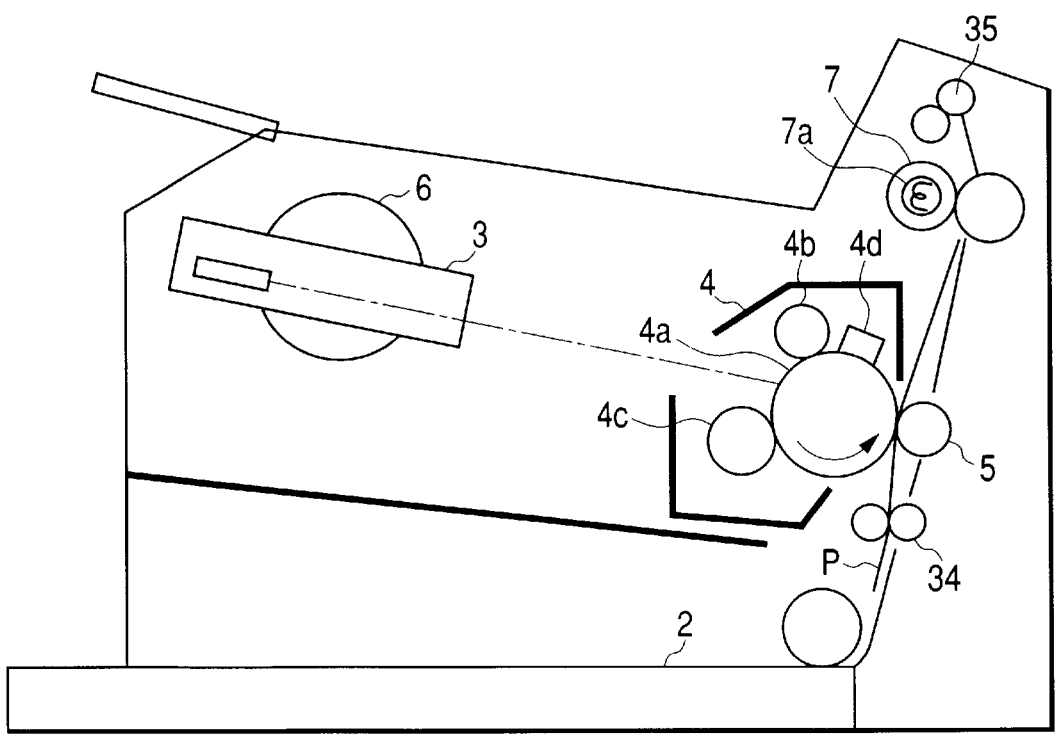
FIG. 1 is a side sectional view of an image forming apparatus that is an embodiment of the present invention.
Figure 2:
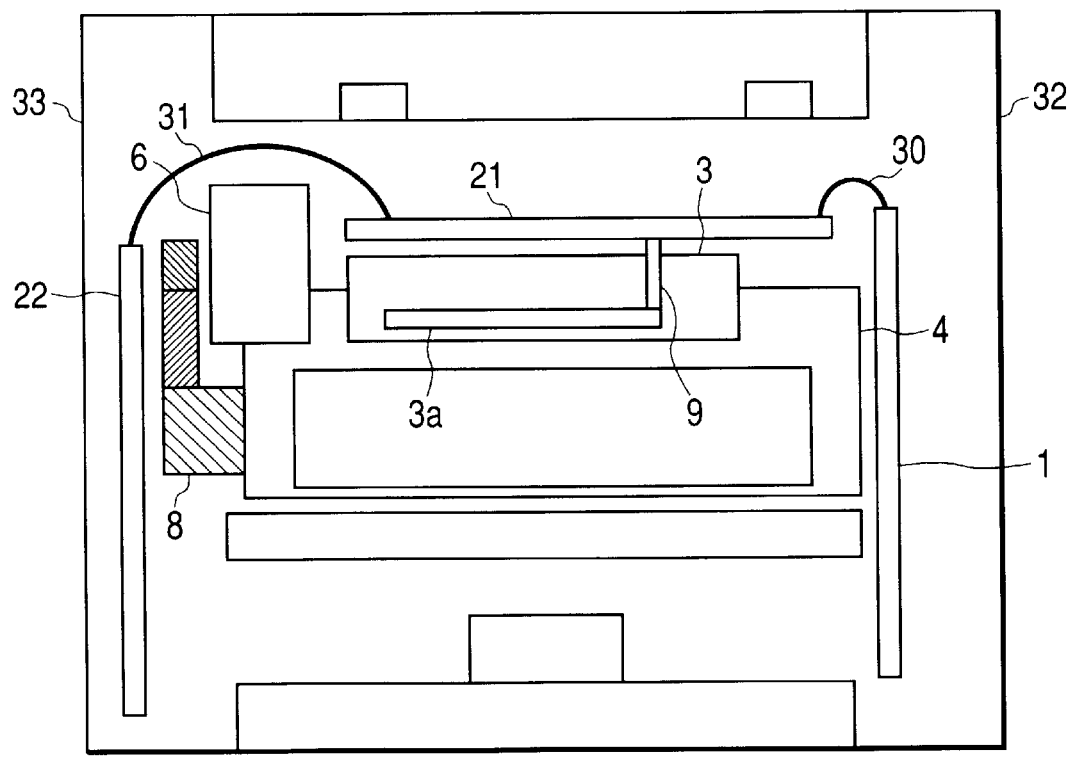
FIG. 2 is a front sectional view of the image forming apparatus.
Figure 3:
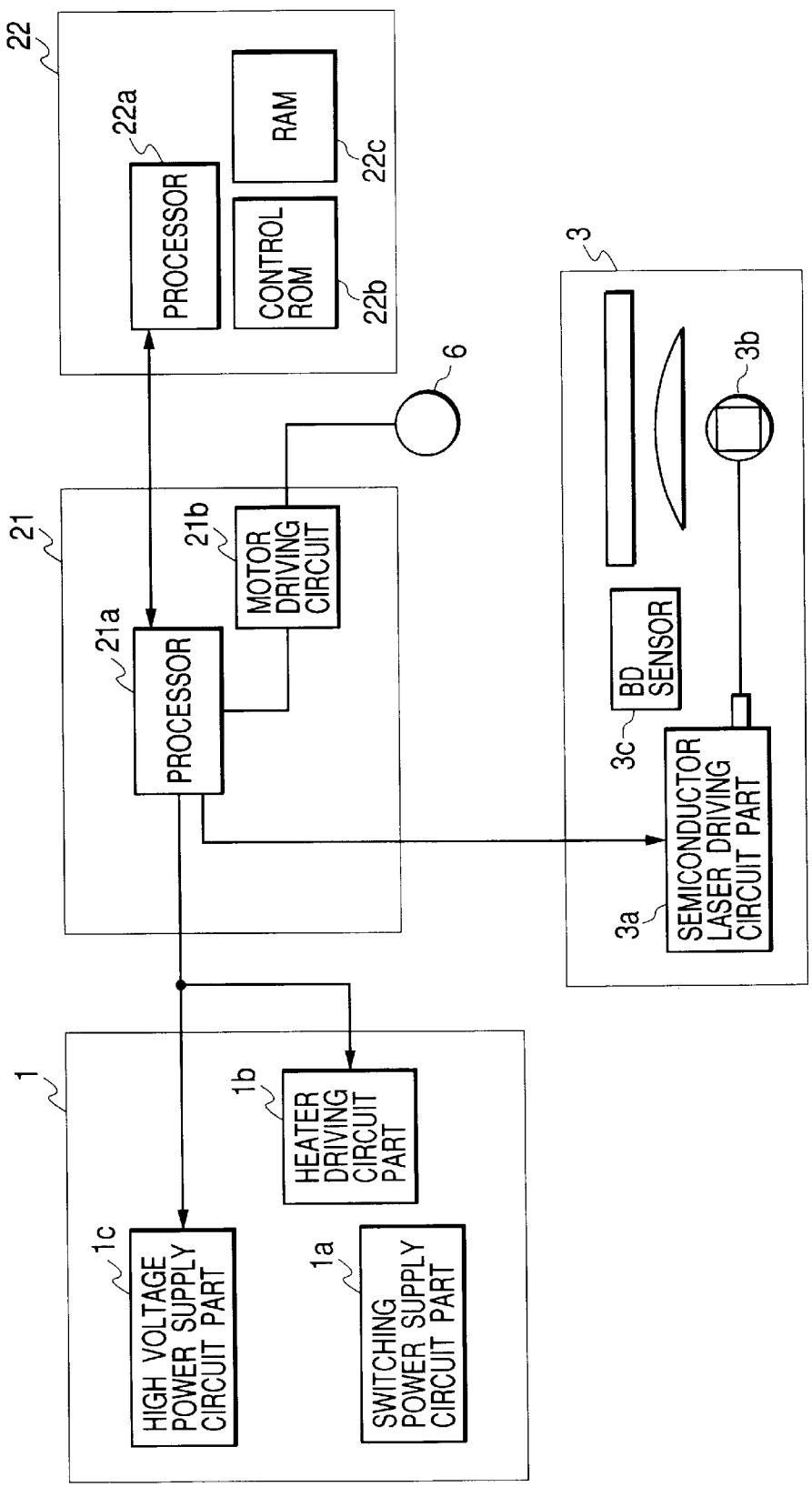
FIG. 3 is a circuit functional block diagram of the image forming apparatus.

FIG. 1 is a side sectional view of an image forming apparatus such as a laser printer in accordance with an embodiment of the present invention. FIG. 2 is a front sectional view of the image forming apparatus. FIG. 3 is a functional block diagram of circuit substrates.

In FIG. 1, laser beams emitted from a scanner unit 3 are incident on a photosensitive drum 4a, which is charged by charging means 4b, in a process cartridge 4, and an electrostatic latent image is formed on the photosensitive drum 4a. This electrostatic latent image is developed by developing means 4c, and a toner image is formed on the photosensitive drum 4a. This toner image is transferred to a recording material P, which is conveyed from a sheet feeding cassette 2, by transfer means 5. Thereafter, the recording material P bearing an unfixed toner image is conveyed to fixing means 7, and the unfixed toner image is fixed on the recording material P. Reference numeral 6 denotes a motor functioning as driving means (driving source) for driving various mechanism parts including conveying means 34 and 35 for conveying a recording material.

As shown in FIGS. 2 and 3, the image forming apparatus is provided with an engine driving circuit board 1 for driving the apparatus main body, an engine control circuit board 21 for controlling the apparatus main body, an image controller board 22, a scanner unit 3, and a process cartridge 4. The engine driving circuit board 1 is constituted by a switching power supply circuit part 1a, a heater driving circuit part 1b for driving a fixing heater 7a (see FIG. 1), a high voltage power supply circuit part 1c necessary for an electrophotographic process, and the like. The engine control circuit board 21 is constituted by a high voltage power supply circuit control part necessary for an electrophotographic process, a heater control circuit part, a laser scanner control circuit part, a motor drive control circuit part, a processor 21a for controlling these parts, and the like. Note that, in this embodiment, a motor driving circuit 21b is also mounted in the engine control circuit board 21. In addition, each control signal is connected to the engine driving circuit substrate 1 by a bundled line.

The image controller board 22 is constituted by a processor 22a for generating bit map data, which is used for modulating ON/OFF a semiconductor laser, based on image data from a not-shown host computer and communicating with an engine control circuit, a control ROM 22b, an RAM 22c for temporarily storing the bit map data, and the like.

The scanner unit 3 is constituted by a semiconductor laser driving circuit part 3a for driving the semiconductor laser based on ON/OFF data from the image controller board 22, a polygon scanner 3b for horizontally scanning laser beams from the semiconductor laser on a photosensitive drum, a BD sensor 3c for generating a horizontal synchronizing signal, and the like. In the figure, the process cartridge 4 is constituted by a photosensitive drum 4a, a charging roller 4b, a developing device 4c, a cleaner container 4d, and the like.

As shown in FIG. 2, in this embodiment, the engine driving circuit board 1 is arranged substantially vertically along a side of the apparatus main body on the opposite side of a driving unit 8, and is connected to the engine control circuit board 21 by a connection part 30. The engine control circuit board 21 is arranged in a planar state substantially horizontally above the scanner unit 3. In addition, the image controller board 22 is arranged substantially vertically along a side of the apparatus main body on the driving unit 8 side, and is connected to the engine control circuit board 21 by a connection part 31.

That is, of both sides 32 and 33 of the apparatus main body opposed to each other, the engine driving circuit board 1 is provided along one side 32 in the vicinity thereof, and the image controller board 22 is provided along the other side 33 in the vicinity thereof. The engine control circuit board 21 is provided in the vicinity of upper ends of the engine driving circuit board 1 and the image controller board 22.

In addition, the driving source 6 for driving the mechanism parts of the apparatus main body is provided close to the side 33 on the opposite side of the side 32 along which the engine driving circuit substrate 1 is provided.

The engine control circuit board 21 and the laser driving circuit board 3a are directly connected by a connector 9, whereby a VDO signal, a laser control signal, a polygon motor control signal, and the like based on data from the image controller board 22 are exchanged between the engine control circuit board 21 and the laser driving circuit board 3a not through a bundle line.

In this way, according to the structure described above, the engine control circuit board 21 and the engine driving circuit board 1 or the engine control circuit board 21 and the image controller board 22 are arranged proximate to each other. Thus, it is possible to reduce a length of a connection part between them to suppress generation of noises. In particular, since a high-frequency control signal such as a VDO signal is connected with extremely shortened wiring, it is possible to reduce RFI, and costs for coping with RFI can be significantly reduced. In addition, in this case, since the engine driving circuit substrate 1 is arranged along the side of the apparatus main body vertically and is arranged on the opposite side of the motor 6 functioning as a heat generating component, heat radiation efficiency of the heat generation component on the engine driving circuit substrate 1 is high. Thus, even if a cooling fan or the like is not used, the heat generation component can be cooled efficiently.

Figure 4:
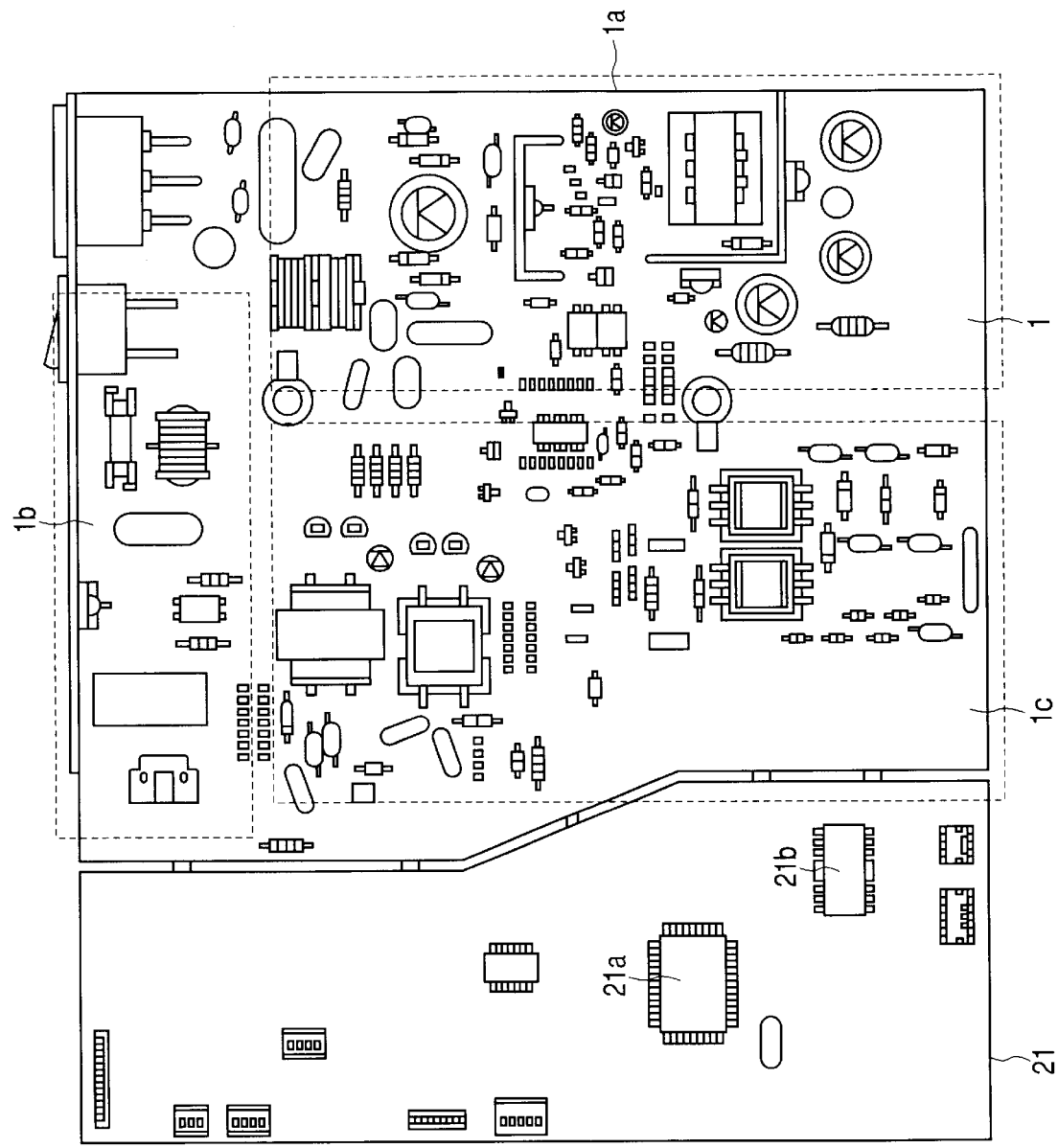
FIG. 4 is a substrate structure diagram for illustrating another embodiment of the present invention.
Figure 5:
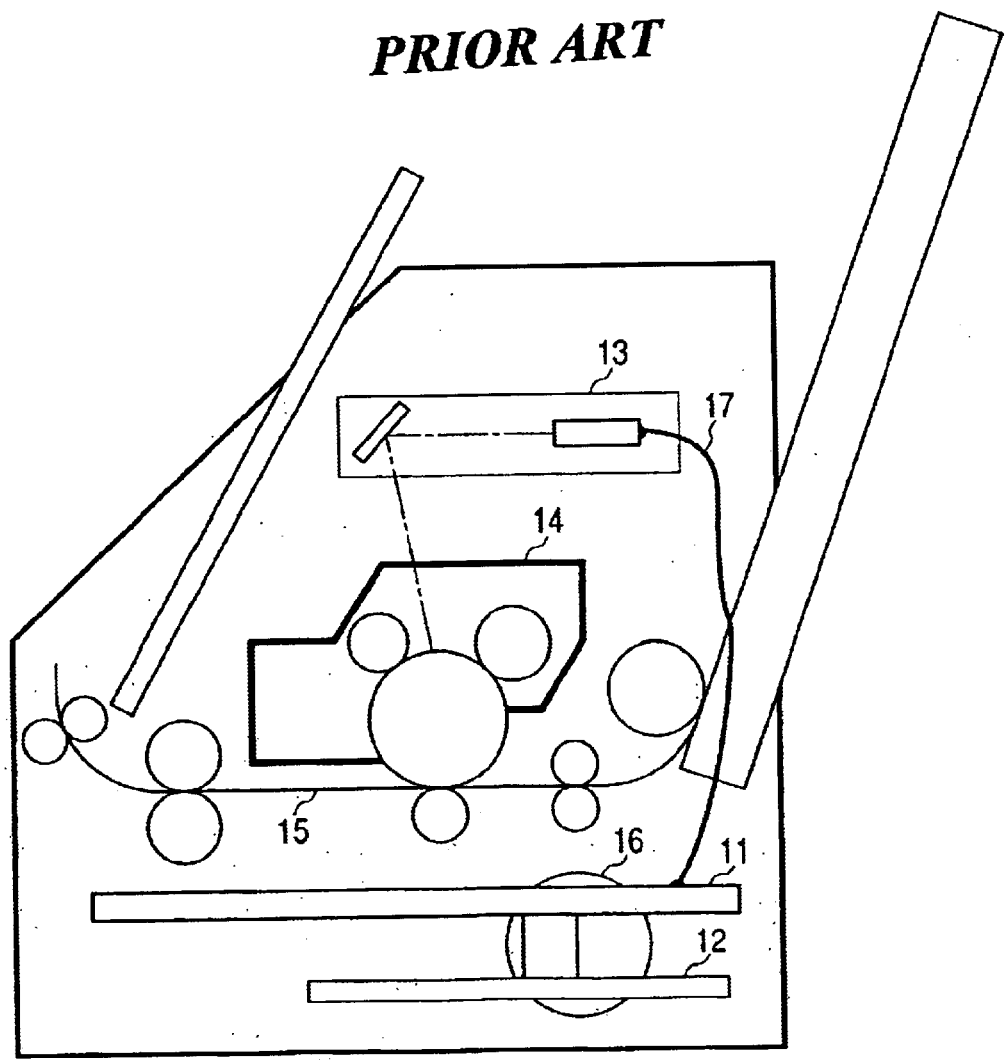
FIG. 5 is a side sectional view of a conventional image recording apparatus.
Figure 6:
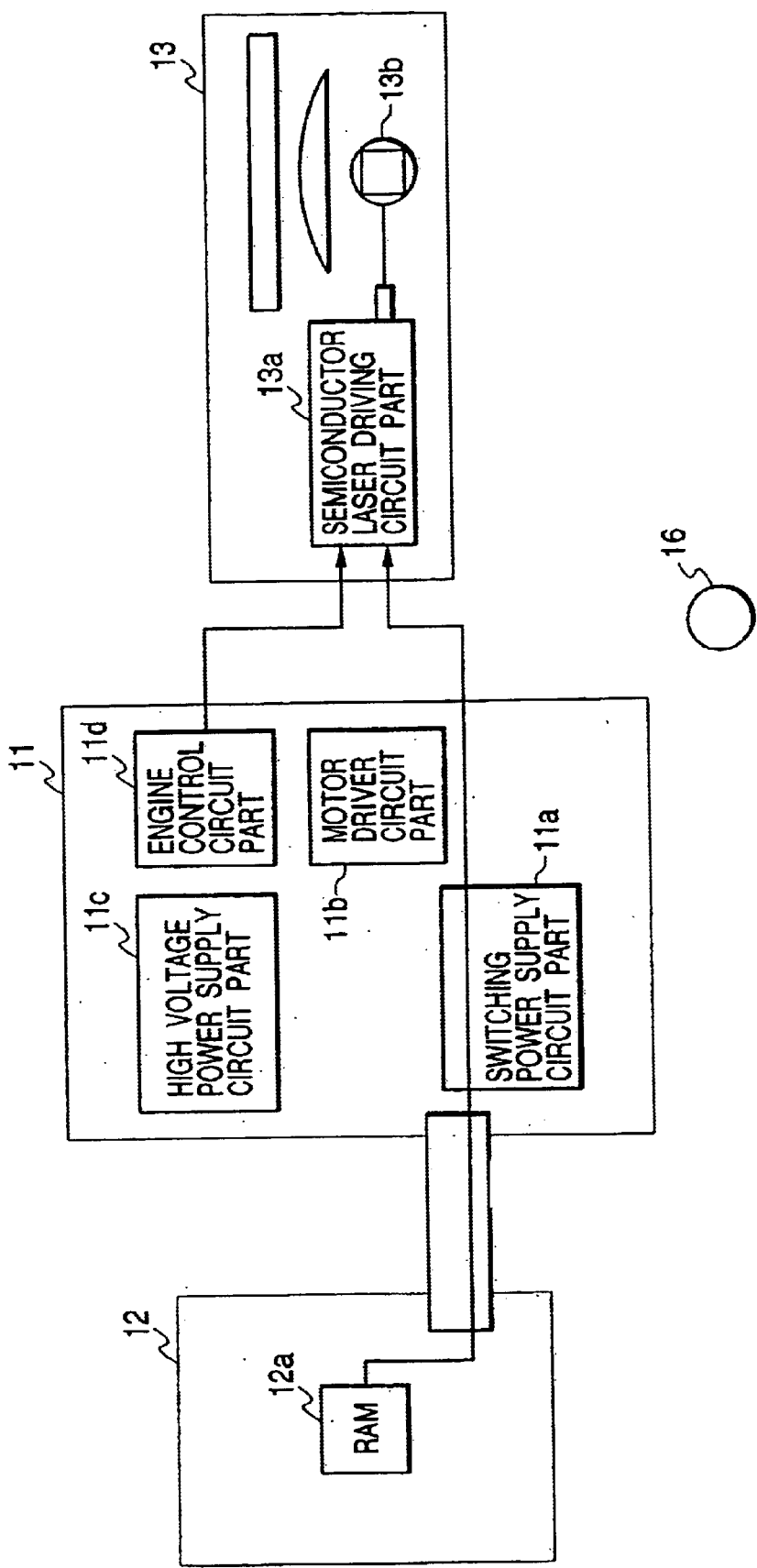
FIG. 6 is a circuit functional block diagram of the conventional image recording apparatus.

Next, another embodiment of the present invention will be described. FIG. 4 is a diagram showing boards in another embodiment of the present invention. In the board structure shown in the figure, the engine driving circuit board 1 and the engine control circuit board 21 arranged on one substrate.

According to this structure, after mounting components on the substrate, the substrate is divided to be mounted in the apparatus main body, whereby the components can be collectively mounted on the substrate, as a circuit board and at the same time, operation of the circuit board can be checked at one time before assembly. As a result, costs for mounting components on a substrate and costs for checking functions can be significantly reduced, and cost reduction of the apparatus main body can be realized.

As is clear from the above descriptions, according to the above-mentioned embodiment, in an image forming apparatus for modulating ON/OFF laser beams based on image data from an external apparatus, forming an electrostatic latent image on a photosensitive member, and forming an image on a recording material by an electrophotographic process is provided. The image forming apparatus has laser beam scanning means for scanning laser beams on the photosensitive member, conveying means for feeding and conveying the recording material, driving means, which is arranged close to one side of an apparatus main body, for driving mechanism parts including the conveying means, first circuit means constituted by a power supply circuit part and a driving circuit part for driving an electrophotographic process, second circuit means for controlling the driving circuit means for driving the mechanism parts, a process control circuit and the laser beam scanning means, third circuit means for generating image data that is used for modulating ON/OFF laser beams. In the image forming apparatus, the first circuit means is arranged vertically along the side of the apparatus main body on the opposite side of the driving means, the second circuit means is arranged horizontally above or below the laser beam scanning means, and the third circuit means is arranged vertically along the side of the apparatus main body on the driving means side. Thus, a high-frequency wiring part can be shortened to realize reduction of radiation field noises and costs for coping with the noises, and at the same time, heat radiation efficiency can be increased to prevent deterioration of components, degradation of an image quality, and the like due to increase in temperature in the apparatus.

The embodiments of the present invention have been described above. The present invention is not limited to the above-mentioned embodiments at all, and various modifications are possible within technical thought of the present invention.

What is claimed is:

1. An image forming apparatus comprising:
    a driving circuit board for driving a main body of an apparatus;
    a control circuit board for controlling the main body of the apparatus; and
    an image controller board for controlling image data,
    wherein said driving circuit board is connected to said control circuit board, and said control circuit board is connected to said image controller board, and
    wherein said driving circuit board and said image controller board are provided substantially vertically, and said control circuit board is provided substantially horizontally.

2. An image forming apparatus according to claim 1, wherein the main body of the apparatus has both sides which are opposed to each other, said driving circuit board is provided along one side of both sides in the vicinity thereof, and said image controller board is provided along the other side of both sides in the vicinity thereof.

3. An image forming apparatus according to claim 2, further comprising a driving source for driving mechanism part of the main body of the apparatus,
    wherein said driving source is provided close to the side on the opposite side of the side along which said driving circuit board is provided.

4. An image forming apparatus according to claim 1,
    wherein said control circuit board is provided in the vicinity of upper ends of said driving circuit board and said image controller board.

5. An image forming apparatus according to claim 1, further comprising a laser driving circuit board for driving a laser,
    wherein said laser driving circuit board is connected to said control circuit board by a connector.

6. An image forming apparatus according to claim 1,
    wherein said driving circuit board and said control circuit board are formed by mounting components on a substrate, and then, dividing the substrate.

7. An image forming apparatus according to claim 1,
    wherein said driving circuit board has a switching power supply board part, a heater driving circuit part and a high voltage power supply circuit part, said control circuit board has a high voltage power supply control circuit part, a heater control circuit part, a laser scanner control circuit part, a motor drive control circuit part and a processor for controlling these parts, and said image controller board has a processor for generating bit map data, which is used for modulating ON/OFF a laser, based on image data and communicating with a control circuit, an ROM, and an RAM.

* * * * *